US008869994B2

(12) United States Patent
He

(10) Patent No.: US 8,869,994 B2
(45) Date of Patent: Oct. 28, 2014

(54) SERVER RACK WITH LOCKABLE TRAY

(75) Inventor: Yu-Wei He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 152 days.

(21) Appl. No.: 13/527,672

(22) Filed: Jun. 20, 2012

(65) Prior Publication Data
US 2013/0087518 A1    Apr. 11, 2013

(30) Foreign Application Priority Data

Oct. 7, 2011 (CN) .......................... 2011 1 0293080

(51) Int. Cl.
*A47F 7/00* (2006.01)
*H05K 7/14* (2006.01)

(52) U.S. Cl.
CPC .................................. *H05K 7/1489* (2013.01)
USPC .......................................... 211/26; 312/223.2

(58) Field of Classification Search
CPC ....... G06F 1/187; G06F 1/184; H05K 7/1409; H05K 7/1489
USPC ................. 211/26, 26.2, 41.12, 88.01, 126.1; 312/223.1, 223.2, 332.1; 361/679.57, 361/679.58, 724–727, 679.43; 248/220.21, 248/222.11, 222.14, 225.11
See application file for complete search history.

(56) References Cited

U.S. PATENT DOCUMENTS

| | | | | |
|---|---|---|---|---|
| 4,947,661 A * | 8/1990 | Yoshida | ............................. | 70/57 |
| 5,414,594 A * | 5/1995 | Hristake | ....................... | 361/755 |
| 6,373,692 B1 * | 4/2002 | Cheng | ....................... | 361/679.59 |
| 6,643,139 B2 * | 11/2003 | Tien | ............................... | 361/727 |
| 7,301,778 B1 * | 11/2007 | Fang | ............................. | 361/759 |
| 7,342,808 B2 * | 3/2008 | Chen et al. | ..................... | 361/801 |
| 7,420,812 B2 * | 9/2008 | Chen et al. | ..................... | 361/724 |
| 7,447,010 B2 * | 11/2008 | Chen | ....................... | 361/679.33 |
| 7,616,436 B2 * | 11/2009 | DeMoss et al. | ......... | 361/679.34 |
| 8,289,707 B2 * | 10/2012 | Liao | ......................... | 361/679.58 |
| 8,596,472 B2 * | 12/2013 | Yin et al. | ........................ | 211/26 |
| 8,616,662 B2 * | 12/2013 | Yin et al. | ................... | 312/223.2 |
| 8,641,313 B1 * | 2/2014 | Crippen et al. | ............ | 403/322.1 |
| 2004/0100762 A1 * | 5/2004 | Yuan et al. | ..................... | 361/685 |
| 2005/0035603 A1 * | 2/2005 | Chen et al. | .................... | 292/116 |
| 2005/0068721 A1 * | 3/2005 | Chen et al. | ..................... | 361/685 |
| 2006/0274488 A1 * | 12/2006 | Simmons et al. | ............. | 361/681 |

(Continued)

FOREIGN PATENT DOCUMENTS

WO    WO2010147593 A1 * 12/2010

*Primary Examiner* — Darnell Jayne
*Assistant Examiner* — Hiwot Tefera
(74) *Attorney, Agent, or Firm* — Novak Druce Connolly Bove + Quigg LLP

(57) ABSTRACT

A server rack includes a side plate and a tray. A pin is secured on the side plate. A tray includes a sidewall. A slit is defined in the sidewall. A locking member is pivotally mounted on the sidewall. The locking member includes a locking protrusion which is adapted to be slide in the slit to abut the pin. An elastic piece is secured on the sidewall. The locking member is pressed by the elastic piece. The locking member rotates on the sidewall to have the locking protrusion sliding out of the slit and moving away from the pin. The elastic piece is elastically deformed by the locking member when the locking member rotates on the sidewall, rebounds to rotate the locking member backward to have the locking protrusion sliding in the slit and abutting the shaft portion.

17 Claims, 4 Drawing Sheets

(56) References Cited

U.S. PATENT DOCUMENTS

| | | |
|---|---|---|
| 2008/0019036 A1* | 1/2008 | Chu et al. .................. 360/97.01 |
| 2008/0123280 A1* | 5/2008 | Chen et al. ................... 361/685 |
| 2009/0212182 A1* | 8/2009 | Ding ....................... 248/225.11 |
| 2011/0051356 A1* | 3/2011 | Yang et al. ............... 361/679.39 |
| 2011/0110032 A1* | 5/2011 | Kuo et al. ................ 361/679.58 |
| 2011/0119866 A1* | 5/2011 | Lee .............................. 16/110.1 |
| 2012/0087084 A1* | 4/2012 | Nguyen et al. ........... 361/679.37 |
| 2013/0092644 A1* | 4/2013 | Yin et al. ........................ 211/26 |
| 2013/0100593 A1* | 4/2013 | Yin et al. ................. 361/679.01 |

* cited by examiner

SERVER RACK WITH LOCKABLE TRAY

BACKGROUND

1. Technical Field

The present disclosure relates to server racks, especially to a server rack with a lockable tray.

2. Description of Related Art

Computer network systems include many separate computer units or servers which are positioned and stacked relative to each other in a rack. The rack includes a plurality of trays, where each computer unit or server is secured to one tray. The tray can be pulled away from the front of the rack so that each separate computer unit or server can be serviced by technicians for various reasons, such as maintenance, replacement of computer cards, etc., while the server is still in operation. The tray is secured on the rack via screws. When the tray is pulled away from the rack, the screws need to be detached one by one, which is time-consuming.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
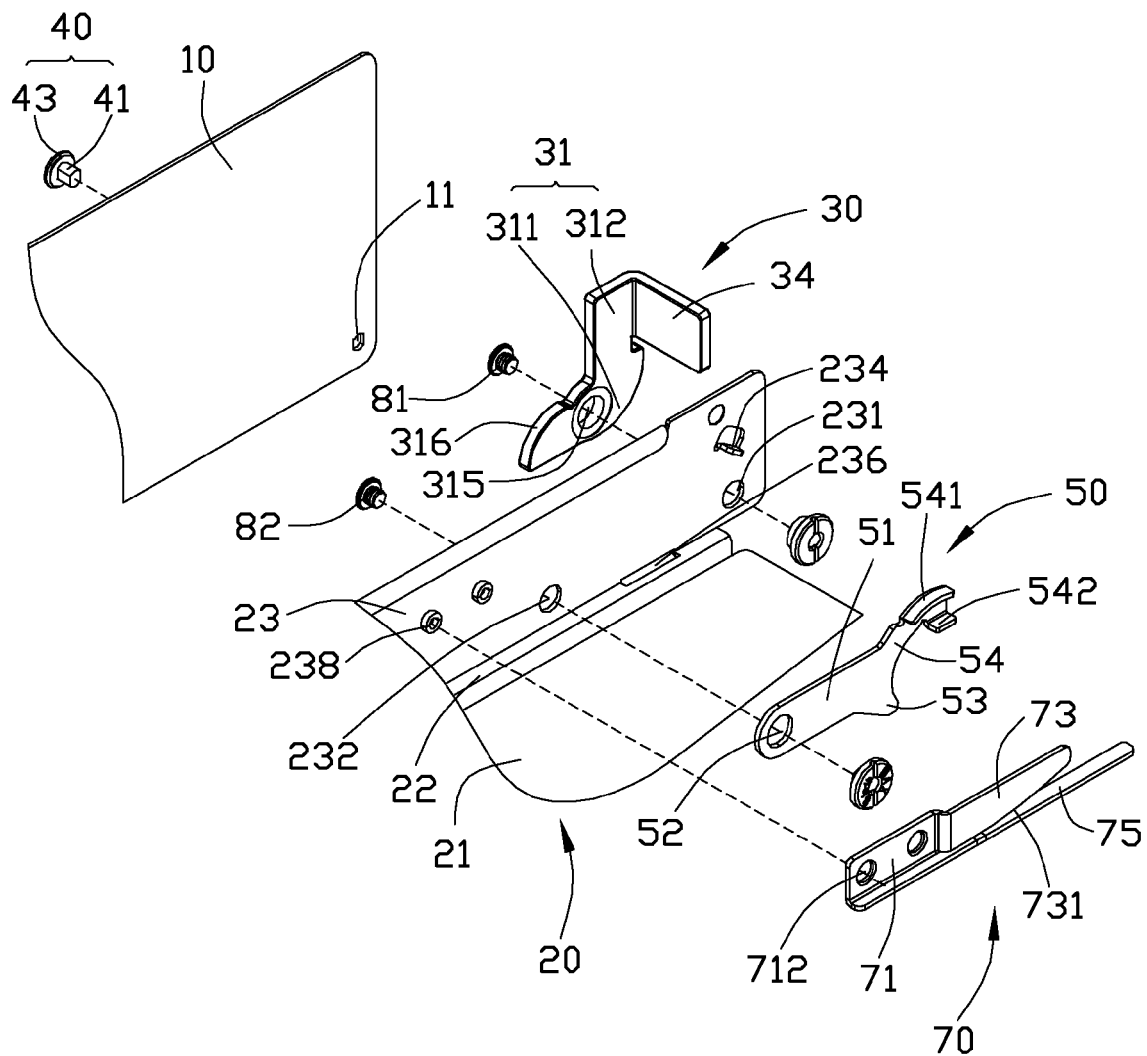
FIG. 1 is an exploded and isometric view of a server rack with a lockable tray.
Figure 2:
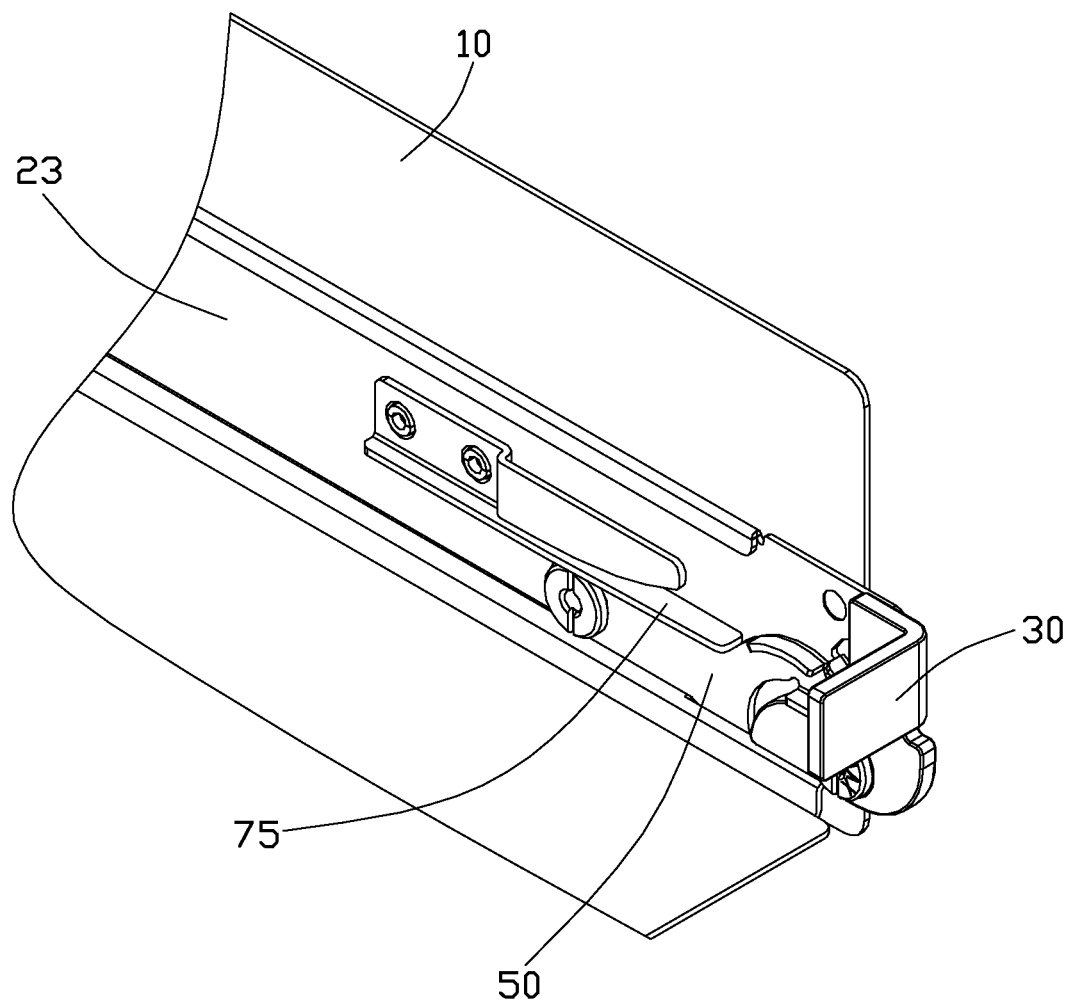
FIG. 2 is an assembled view of the tray of FIG. 1.
Figure 3:
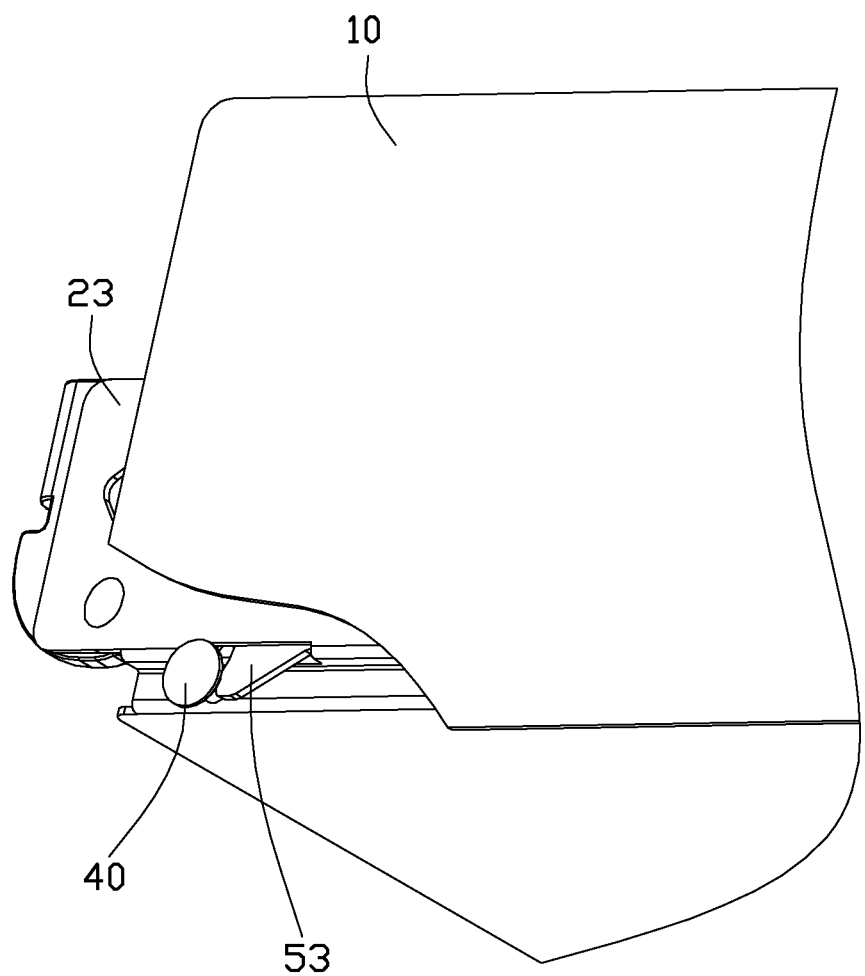
FIG. 3 is an assembled view of the server rack and the tray of FIG. 1.
Figure 4:
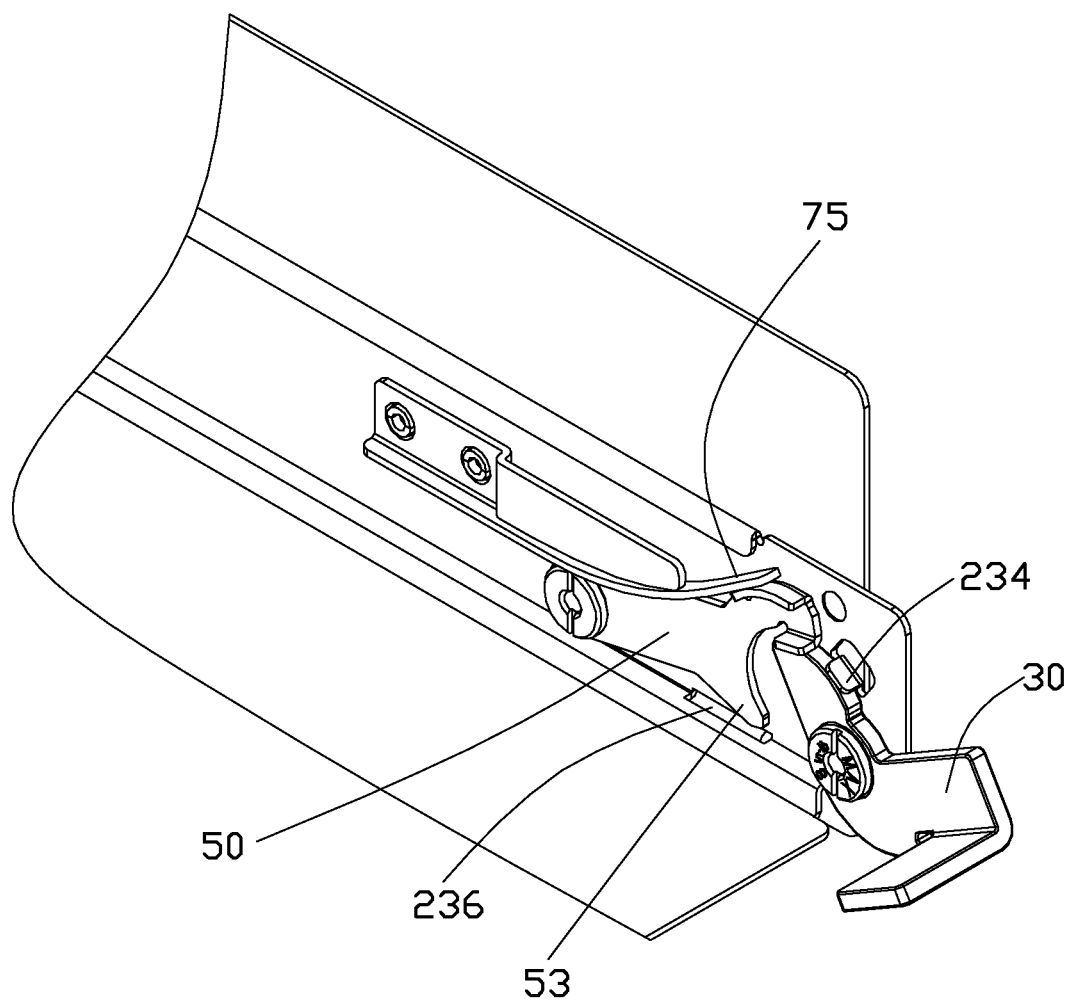
FIG. 4 is another assembled view of the server rack and the tray of FIG. 1.

FIG. 1 illustrates an embodiment of a server rack with a lockable tray 20. The server rack includes a side plate 10. A pin 40 can be mounted on the side plate 10. A rotating member 30, a locking member 50, and a pressing member 70 can be mounted on the tray 20.

The side plate 10 defines a securing hole 11. The pin 40 includes a shaft portion 41 and a head portion 43 connected to an end of the shaft portion 41. Both cross-sections of the securing hole 11 and the shaft portion 41 are non-circular and the same. A diameter of the shaft portion 41 is approximately equal to a diameter of the securing hole 11. A diameter of the head portion 43 is greater than the diameter of the securing hole 11.

The tray 20 includes a bottom wall 21 and a sidewall 23. A step portion 22 is connected between the bottom wall 21 and the sidewall 23. The sidewall 23 defines a first pivot hole 231 and a second pivot hole 232. The first pivot hole 231 is adjacent to a front edge of the sidewall 23. The second pivot hole 232 is located in a middle portion of the sidewall 23. A stop piece 234 is formed on the sidewall 23. The stop piece 234 is located above the first pivot hole 231. A slit 236 is defined in a connection portion of the step portion 22 and the sidewall 23. The slit 236 is located between the first pivot hole 231 and the second pivot hole 232. A pair of mounting bosses 238 is secured on the sidewall 23. The pair of mounting bosses 238 are not located between the first pivot hole 231 and the second pivot hole 232, and are adjacent to the second pivot hole 232.

The rotating member 30 includes a rotating piece 31 and a pull piece 34 perpendicularly connected to the rotating piece 31. The rotating piece 31 is "L"-shaped, and includes a driving portion 311 and a connection portion 312. The driving portion 311 defines a first through hole 315 corresponding to the first pivot hole 231. An arc-shaped driving surface 316 is formed on the driving portion 311. The connection portion 312 is perpendicularly connected to the pull piece 34.

The locking member 50 includes a main body 51. One end of the main body 51 defines a second through hole 52. The other end of the main body 51 forks to form an extending piece 54 at an upper portion thereof and a locking protrusion 53 at a lower portion thereof. A top side of the extending piece 54 forms a first abutting piece 541. A bottom side of the extending piece 54 forms a second abutting piece 542.

The pressing member 70 includes a mounting piece 71. The mounting piece 71 defines a pair of mounting holes 712 corresponding to the pair of mounting bosses 238 of the sidewall 23. A front end of the mounting piece 71 extends forward to form a restricting piece 73. A bottom end of the mounting piece 71 is tilted to form a restricting end 731. An elastic piece 75 is connected to a bottom end of the mounting piece 71. The elastic piece 75 and the restricting end 731 are separated, and the elastic piece 75 can be elastically deformed until the elastic piece 75 abuts the restricting end 731.

Referring to FIGS. 1 to 4, in assembly, the first through hole 315 of the rotating member 30 is aligned to the first pivot hole 231 of the sidewall 23. A first pivot shaft 81 is pivotally mounted on the first pivot hole 231 and the first through hole 315 to pivotally mount the rotating member 30 on the sidewall 23. Then, the locking protrusion 53 of the locking member 50 is inserted in the slit 236. The second through hole 52 of the locking member 50 is aligned to second pivot hole 232 of the sidewall 23. A second pivot shaft 82 is pivotally mounted in the second pivot hole 232 and the second through hole 52 to pivotally mount the locking member 50 on the sidewall 23. Successively, the pair of mounting bosses 238 are secured in the mounting holes 712 of the pressing member 70 to mount the pressing member 70 on the sidewall 23. At this position, the elastic piece 75 of the pressing member 70 presses on the main body 51 of the locking member 50, and the driving surface 316 of the rotating member 30 is located below the second abutting piece 542 of the locking member 50.

The shaft portion 41 of the pin 40 is interference inserted in the securing hole 11 of the side plate 10, and secured in the securing hole 11. Part of the shaft portion 41 is protruded on the side plate 10.

To mount the tray 20 in the server rack, the tray 20 is moved in the rack. The sidewall 23 of the tray 20 faces to the side plate 10 of the rack. The tray 20 moves until the locking protrusion 53 abuts the shaft portion 41. Then, the pull piece 34 of the rotating member 30 is pulled to rotate the rotating member 30. The driving surface 316 of the rotating member 30 pushes the second abutting piece 542 to rotate the locking member 50. The main body 51 moves to elastically deform the elastic piece 75. The rotating member 30 rotates until abutting the stop piece 234. The elastic piece 75 abuts the restring end 731, and the locking protrusion 53 slides out of the slit 236 to move away from the shaft portion 41. The tray 20 continues moving in the rack. The locking protrusion 53 also moves in the rack. The pull piece 34 of the rotating member 30 is released. The elastic piece 75 rebounds to push the locking member 50 rotating backward. The second abutting piece 542 pushes the rotating member 30 to rotate backward. The locking protrusion 53 moves in the slits 236. The shaft portion 41 blocks the locking protrusion 53 to prevent the tray 20 from moving out of the rack. Therefore, the tray 20 is mounted on the rack.

To detach the tray 20 from the rack, the pull piece 34 is pulled to have the locking protrusion 53 sliding out of the slit 236 and moving away from the shaft portion 41. Then, the tray 20 can be detached from the rack freely.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the invention to the full extent indicated by the broad general meaning of the terms in which the appended claims are expressed.

What is claimed is:

1. A server rack, comprising:
   a side plate, a pin secured on the side plate;
   a tray comprising a sidewall, a slit defined in the sidewall, a locking member pivotally mounted on the sidewall, the locking member comprising a locking protrusion slidable into the slit to abut the pin, and an elastic piece secured on the sidewall, the locking member being pressed by the elastic piece; and
   a pressing member secured on the sidewall and comprising a restricting piece located above the elastic piece;
   wherein the locking member is adapted to rotate on the sidewall to have the locking protrusion sliding out of the slit and moving away from the pin, the elastic piece is adapted to be elastically deformed by the locking member when the locking member rotates on the sidewall, and the restricting piece is adapted to abut the elastic piece when the elastic piece is elastically deformed; and the elastic piece is adapted to rebound to rotate the locking member to have the locking protrusion sliding back in to the slit and abutting the pin.

2. The server rack of claim 1, wherein the elastic piece is connected on the pressing member, an end of the restricting piece facing the elastic piece is tilted to form a restricting end, and the restricting end is adapted to abut the elastic piece when the elastic piece is elastically deformed.

3. The server rack of claim 1, wherein the pressing member defines a pair of mounting holes, a pair of mounting bosses are secured on the sidewall, and each of the pair of mounting bosses is secured in each of the pair of mounting holes.

4. The server rack of claim 1, wherein the side plate defines a securing hole, the pin comprises a shaft portion and a head portion connected to an end of the shaft portion, both of cross sections of the securing hole and the shaft portion are non-circular and have a same configuration, and the shaft portion is inserted in the securing hole.

5. The server rack of claim 1, wherein the locking member comprises a main body, one end of the main body is pivotally secured on the sidewall, another end of the main body forks to form an extending piece at an upper portion thereof and the locking protrusion at a lower portion thereof.

6. The server rack of claim 5, wherein a rotating member is pivotally mounted on the sidewall, the rotating member comprises a driving surface and a pull piece, the driving surface abuts the extending piece, and the pull piece is adapted to be pulled to have the driving surface to push the locking member to rotate.

7. The server rack of claim 6, wherein a top side of the extending piece forms a first abutting piece, a bottom side of the extending piece forms a second abutting piece, the first abutting piece is adapted to abut the elastic piece, and the second abutting piece is adapted to abut the driving surface.

8. The server rack of claim 6, wherein a stop piece is connected to the sidewall, and the stop piece is adapted to block the rotating member from rotating.

9. The server rack of claim 6, wherein the rotating member comprises a rotating piece perpendicularly connected to the pull piece, the driving surface is formed on the rotating piece, and the rotating piece is attached on the sidewall.

10. A server rack, comprising:
    a side plate, a pin secured on the side plate; and
    a tray comprising a sidewall, a slit defined in the sidewall, a locking member pivotally mounted on the sidewall, the locking member comprising a main body, an end of the main body being forked to form an extending piece at an upper portion thereof and a locking protrusion at a lower portion thereof, a rotating member pivotally mounted on the sidewall, the rotating member comprising a driving surface and a pull piece;
    wherein the locking member is adapted to rotate on the sidewall between a locking position and an unlocking position; in the locking position, the locking protrusion slides into the slit to abut the pin, and the driving surface abuts the extending piece and is located under the extending piece; in the unlocking position, the pull piece is pulled to have the driving surface push the locking member to rotate and to have the locking protrusion sliding out of the slit and moving away from the pin.

11. The server rack of claim 10, wherein an elastic piece is secured on the sidewall, the locking member is pressed by the elastic piece, and the elastic piece is adapted to be elastically deformed when the locking member is in the unlocking position, and the elastic piece is adapted to rebound to push the locking member to rotate from the unlocking position to the locking position.

12. The server rack of claim 11, wherein a pressing member is secured on the sidewall, the elastic piece is connected on the pressing member, the pressing member comprises a restricting piece located above the elastic piece, an end of the restricting piece facing the elastic piece is tilted to form a restricting end, the restricting end is adapted to abut the elastic piece when the elastic piece is elastically deformed.

13. The server rack of claim 12, wherein the pressing member defines a pair of mounting holes, a pair of mounting bosses are secured on the sidewall, and each of the pair of mounting bosses is secured in each of the pair of mounting holes.

14. The server rack of claim 11, wherein a top side of the extending piece forms a first abutting piece, a bottom side of the extending piece forms a second abutting piece, the first abutting piece is adapted to abut the elastic piece, and the second abutting piece is adapted to abut the driving surface.

15. The server rack of claim 10, wherein a stop piece is connected to the sidewall, and the stop piece is adapted to block the rotating member from rotating.

16. The server rack of claim 10, wherein the rotating member comprises a rotating piece perpendicularly connected to the pull piece, the driving surface is formed on the rotating piece, and the rotating piece is attached on the sidewall.

17. The server rack of claim 10, wherein the side plate defines a securing hole, the pin comprises a shaft portion and a head portion connected to an end of the shaft portion, both of cross sections of the securing hole and the shaft portion are non-circular and have a same configuration, the shaft portion is inserted in the securing hole.

* * * * *